(12) United States Patent
Chien et al.

(10) Patent No.: US 12,219,711 B2
(45) Date of Patent: Feb. 4, 2025

(54) BARE CIRCUIT BOARD

(71) Applicant: Unimicron Technology Corp., Taoyuan (TW)

(72) Inventors: Chun-Hsien Chien, Taoyuan (TW); Hsin-Hung Lee, Taoyuan (TW); Hsuan-Yu Lai, Taoyuan (TW); Yu-Chung Hsieh, Taoyuan (TW); Hung-Pin Yu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 121 days.

(21) Appl. No.: 18/155,708

(22) Filed: Jan. 17, 2023

(65) Prior Publication Data

US 2023/0262900 A1   Aug. 17, 2023

Related U.S. Application Data

(60) Provisional application No. 63/302,135, filed on Jan. 24, 2022.

(30) Foreign Application Priority Data

Jan. 5, 2023 (TW) ................. 112100433

(51) Int. Cl.
*H01Q 1/48* (2006.01)
*H05K 1/11* (2006.01)
*H05K 1/18* (2006.01)

(52) U.S. Cl.
CPC ............. *H05K 1/181* (2013.01); *H01Q 1/48* (2013.01); *H05K 1/111* (2013.01); *H05K 2201/10098* (2013.01)

(58) Field of Classification Search
CPC .......... H01Q 1/38; H01Q 1/48; H01Q 1/2283; H01Q 3/267; H01Q 13/206; H05K 1/111; (Continued)

(56) References Cited

U.S. PATENT DOCUMENTS 4,565,966 A   1/1986   Burr et al.
5,502,889 A   4/1996   Casson et al.
(Continued)

FOREIGN PATENT DOCUMENTS

CN   101932944 B   9/2014
TW      516342 B   1/2003
(Continued)

*Primary Examiner* — Tung X Le
(74) *Attorney, Agent, or Firm* — CKC & Partners Co., LLC

(57) ABSTRACT

A bare circuit board is provided, in which the bare circuit board includes a substrate, an antenna, a chip pad, a ground pattern and a trace. The substrate includes a surface. The antenna and the chip pad are formed on the substrate. The ground pattern is formed on the surface. The trace is formed on the surface and isn't connected to the ground pattern. A measuring gap is formed between the trace and an edge of the ground pattern, and the trace includes a first end and a second end. The first end is electrically connected to the chip pad, whereas the second end is electrically connected to the antenna. The bare circuit board is adapted to transmit a signal. The width of the measuring gap is smaller than a quarter of an equivalent wavelength of the signal.

15 Claims, 9 Drawing Sheets

(58) Field of Classification Search
CPC ...... H05K 1/165; H05K 1/181; H05K 1/0268; H05K 2201/10098; G01R 29/10; G01R 31/2822; G01R 31/2884; G01R 31/3025
See application file for complete search history.

(56) References Cited

U.S. PATENT DOCUMENTS

| | | | |
|---|---|---|---|
| 6,943,739 B1* | 9/2005 | Rousu | H04B 17/15 |
| | | | 343/702 |
| 7,844,226 B2* | 11/2010 | Kurashima | G01R 31/2886 |
| | | | 455/67.14 |
| 2001/0023176 A1* | 9/2001 | Talvitie | G01R 1/06772 |
| | | | 455/67.14 |
| 2009/0066592 A1* | 3/2009 | Dokai | G06K 7/10316 |
| | | | 343/703 |
| 2009/0153332 A1* | 6/2009 | Dokai | G06K 19/0722 |
| | | | 340/572.1 |
| 2012/0293379 A1* | 11/2012 | Nickel | G01R 31/2822 |
| | | | 343/703 |
| 2016/0301125 A1* | 10/2016 | Kim | H01P 5/107 |
| 2022/0006185 A1* | 1/2022 | Yetisir | H04B 17/12 |

FOREIGN PATENT DOCUMENTS

| | | |
|---|---|---|
| TW | I572095 B | 2/2017 |
| TW | I697681 B | 7/2020 |

* cited by examiner

BARE CIRCUIT BOARD

CROSS-REFERENCE TO RELATED APPLICATION

This application claims priority to U.S. Provisional Patent Application No. 63/302,135, filed Jan. 24, 2022, and claims priority to Taiwan Application Serial Number 112100433, filed Jan. 5, 2023. Each of the above-mentioned patent applications is herein incorporated by reference in its entirety.

BACKGROUND

Technical Field

The present disclosure relates to a circuit board. More particularly, the present disclosure relates to a bare circuit board which can be inspected without any active component mounted thereto.

Description of Related Art

Most circuit boards employed in conventional mobile devices (such as smartphones and tablet computers) have antennas, so that the mobile device can have the function of wireless communication. This circuit board with the antenna will be inspected after it is complete, so as to ensure that the antenna can work. Before inspecting the circuit board, it is necessary to mount a chip for inspection to the circuit board at first, so that the chip is electrically connected to the antenna and able to control the antenna to transmit and receive wireless signals, thereby inspecting the antenna.

However, since the inspection for the antenna needs the chip for inspection, the current inspection for the antenna has to spend additional time and cost mounting the chip to the circuit board at first, so that the current inspection of the antenna of the circuit board is not only time-consuming, but also costly due to the demand for the chip for inspection. Moreover, the mentioned inspection result contains entire performances of the chip and the circuit board, so an industry isn't able to directly and individually obtain the electrical quality of the circuit board from the inspection result.

SUMMARY

At least one embodiment of the disclosure provides a bare circuit board which is applicable to be directly inspected when no chip is mounted thereto.

A bare circuit board according to at least one embodiment of the disclosure includes a substrate, an antenna, a chip pad, a ground pattern and a trace. The substrate includes a surface. The antenna and the chip pad are formed on the substrate. The ground pattern is formed on the surface. The trace is formed on the surface and configured to be without connecting the ground pattern. A measuring gap is formed between the trace and an edge of the ground pattern, and the trace includes a first end and a second end in which the first end is electrically connected to the chip pad, whereas the second end is electrically connected to the antenna. The bare circuit board is adapted to transmit a signal, and the width of the measuring gap is smaller than a quarter of an equivalent wavelength of the signal.

Based on the above, the bare circuit board according to the above embodiments can directly be inspected by a measurement device through a probe under a condition without using any chip for inspection, thereby shortening the inspection time and directly obtaining the quality for the antenna of the bare circuit board.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
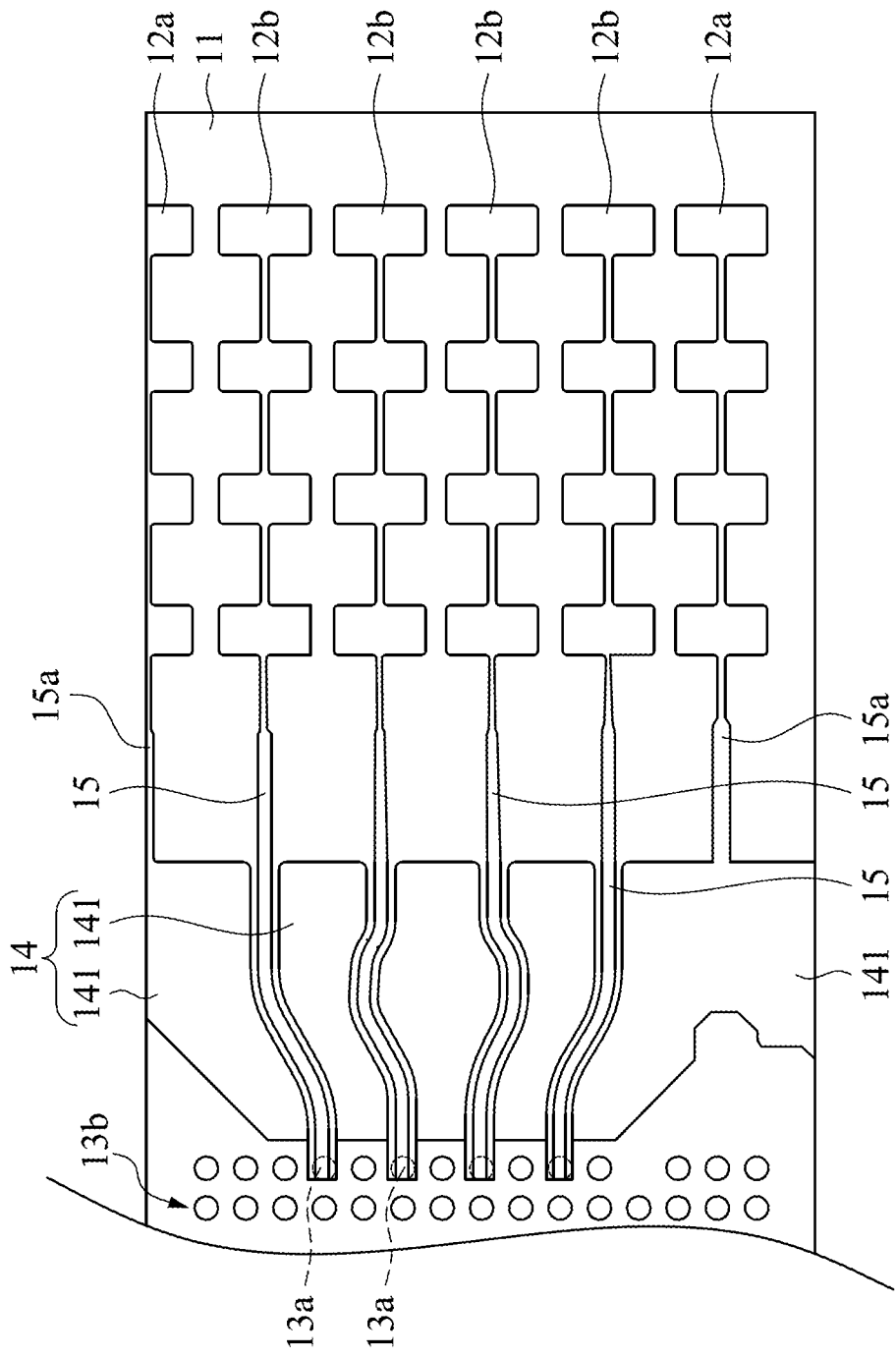
FIG. 1 is a top view of a bare circuit board according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantity, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

Figure 2:
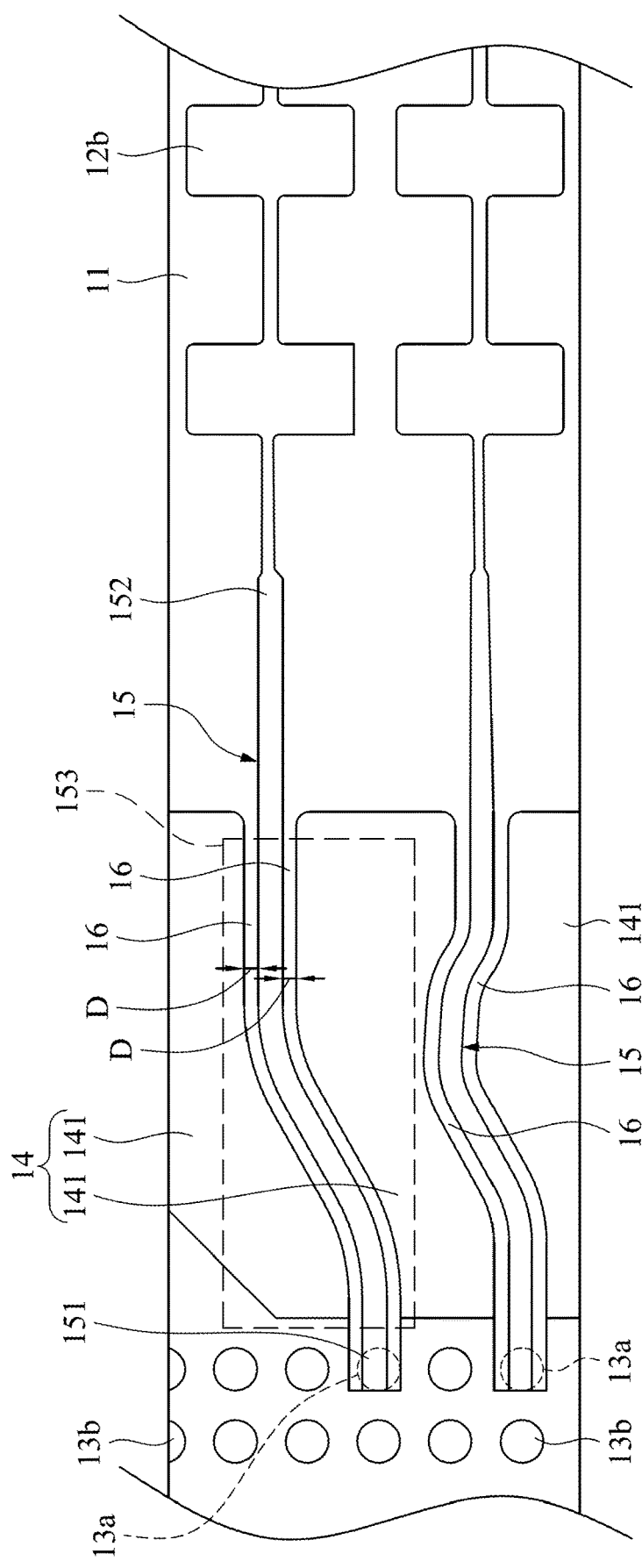
FIG. 2 is a partial enlarged schematic view of FIG. 1.

FIG. 1 is a top view of a bare circuit board according to at least one embodiment of this disclosure, and FIG. 2 is a partial enlarged schematic diagram of FIG. 1. Referring to FIGS. 1 and 2, the bare circuit board 1 includes a substrate 11, at least one antenna, at least one chip pad, a ground pattern 14 and at least one trace. Taking FIG. 1 for example, the bare circuit board 1 includes a plurality of antennas 12a and 12b, a plurality of chip pads 13a and 13b and a plurality of traces 15 and 15a. In other embodiment, the quantity of the antenna (e.g. antennas 12a and 12b) included by the bare circuit board 1 may be only one. In another embodiment, the quantity of the chip pad (e.g. chip pads 13a and 13b) included by the bare circuit board 1 may be only one. In another embodiment, the quantity of the trace (e.g. traces 15a and 15b) may be only one.

The bare circuit board 1 is a wire substrate without any active component mounted. In other words, before the bare circuit board 1 is mounted with any active component, the electric signal that the wire substrate transmits will pass through no active component. In addition, the active component is a transistor or an integrated circuit (IC) with at least one transistor, for example, and the active component also may be a packaged chip or an unpackaged die (also called bare die).

The substrate 11 includes a surface and has a dielectric constant in a range of 3.3 to 3.7. A material of the substrate 11 includes at least one of polytetrafluoroethylene (PTEF), polyphenylene oxide (PPO), cyanate ester (CE) resin, bismaleimide triazine (BT) resin, glass, liquid crystal polymer (LCP), polyimide (PI) and tetra-(4-pyridylphenyl) ethylene (TPPE).

The antennas 12a and 12b are spaced and formed on the substrate 11. In this example, the antennas 12a and 12b are formed as an antenna array. A material of the antennas 12a and 12b includes metal or alloy. In other embodiment, the material of the antennas 12a and 12b further includes nonmetal, and the nonmetal is mixed with the metal or the alloy to be the material of the antennas 12a and 12b.

The chip pads 13a and 13b are formed on the substrate 11. In this example, the chip pads 13a and 13b are provided for mounting an RF (radio frequency) chip (not shown) which controls the transmitting and receiving of the antennas 12a and 12b, in which the RF chip is mounted on the chip pads 13a and 13b by a ball grid array (BGA) packaging technology, but embodiments of this disclosure are not limited thereto. In addition, the chip pads 13a and 13b, the antennas 12a and 12b, and the ground pattern 14 may all be formed on the same surface of the substrate 11. The ground pattern 14 may include a plurality of ground parts 141. The two antennas 12a on two separate positions of the substrate 11 are electrically connected to the two of the ground parts 141 through the traces 15a, respectively.

The traces 15 are formed on the surface. The traces 15 are not connected to and not in contact with the ground pattern 14. Each trace 15 is located between adjacent two of the ground parts 141. A measuring gap 16 is formed between each trace 15 and an edge of the adjacent one of the ground parts 141. Each trace 15 includes a first end 151 and a second end 152, in which the first end 151 is electrically connected to one of the chip pads 13a, whereas the second end 152 is electrically connected to one of the antennas 12b. At least one part of each measuring gap 16 has a constant width D. In this example, each whole measuring gap 16 has the constant width D. The bare circuit board 1 is adapted to transmit a signal having the frequency in a range of 0.1 GHz to 110 GHz. The width of each measuring gap 16 is smaller than a quarter of an equivalent wavelength of the signal, which is represented in equations (1), (2) and (3) as follows:

$$D < \frac{\lambda_g}{4}, \quad (1)$$

$$\lambda_g = \frac{\lambda}{\sqrt{\varepsilon}}, \quad (2)$$

and $$\lambda = \frac{c}{f}, \quad (3)$$

where D is the width of each measuring gap 16; $\lambda_g$ is the equivalent wavelength; $\lambda$ is a wavelength of the signal which is transmitted on the air; $\varepsilon$ is the dielectric constant of the substrate 11. The units of the above equations are in SI systems.

Further, when the frequency of the signal is greater than 0 Hz and less than 45 GHZ, the width D of each measuring gap 16 is in a range of 400 µm to 650 µm. When the frequency of the signal is greater than 45 GHz and less than 110 GHz, the width D of each measuring gap 16 is in a range of 150 µm to 400 µm. When the frequency of the signal is greater than 110 GHZ, the width D of each measuring gap 16 is smaller than or equal to 150 µm.

Figure 3:
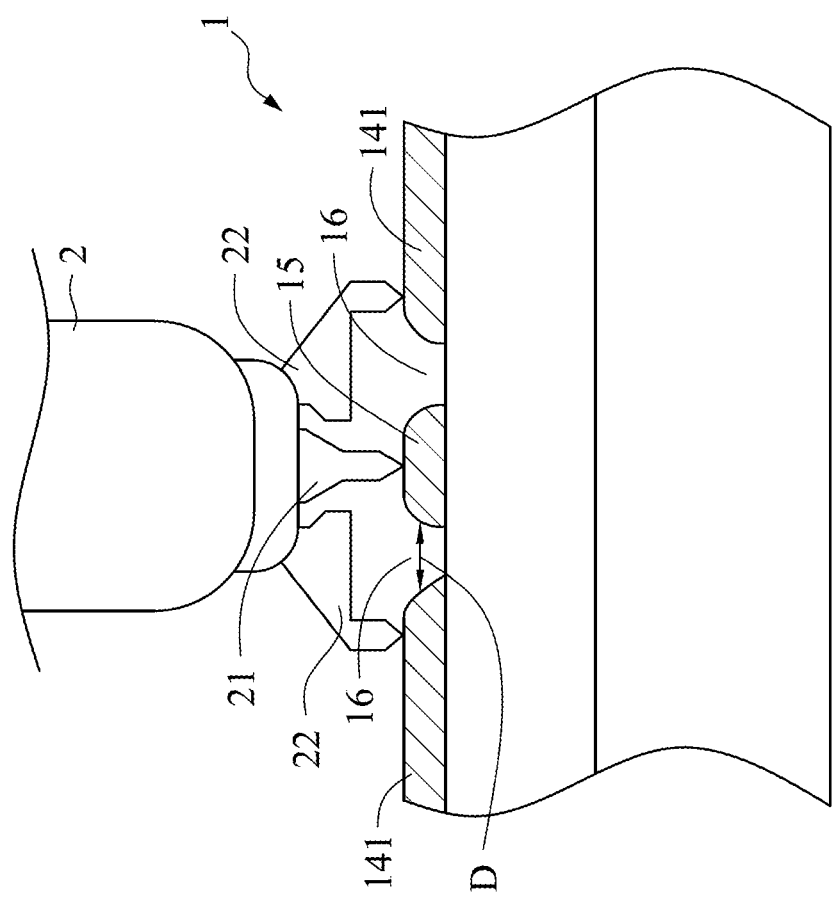
FIG. 3 is a cross-sectional diagram illustrating measurement for the bare circuit board of FIG. 1 by using a probe.

It is worth mentioning that each trace 15 has a measuring region 153 which contains adjacent two of the measuring gaps 16. Therefore, each trace 15 in the corresponding measuring region 153 is appropriate to electrically touch a probe 2 (FIG. 3). In this example, each trace 15 in the measuring region 153 substantially has a constant width.

FIG. 3 is a cross-sectional diagram illustrating measurement for the bare circuit board of FIG. 1 by using the probe 2. Referring to FIG. 3, the probe 2 may be a ground-signal-ground (GSG) probe and support to measure the signal transmitted in 110 GHz. A pitch between a signal tip 21 and each ground tip 22 of the probe 2 may be up to 350 µm. When electrical parameters of the signal in 110 GHz are measured, the signal tip 21 and the ground tips 22 of the probe 2 can electrically touch each trace 15 and the corresponding adjacent ground parts 141 because each width D of each measuring gap 16 is smaller than 150 µm. Therefore, the bare circuit board 1 is applicable to electrically touch the probe 2 to probe.

Figure 4:
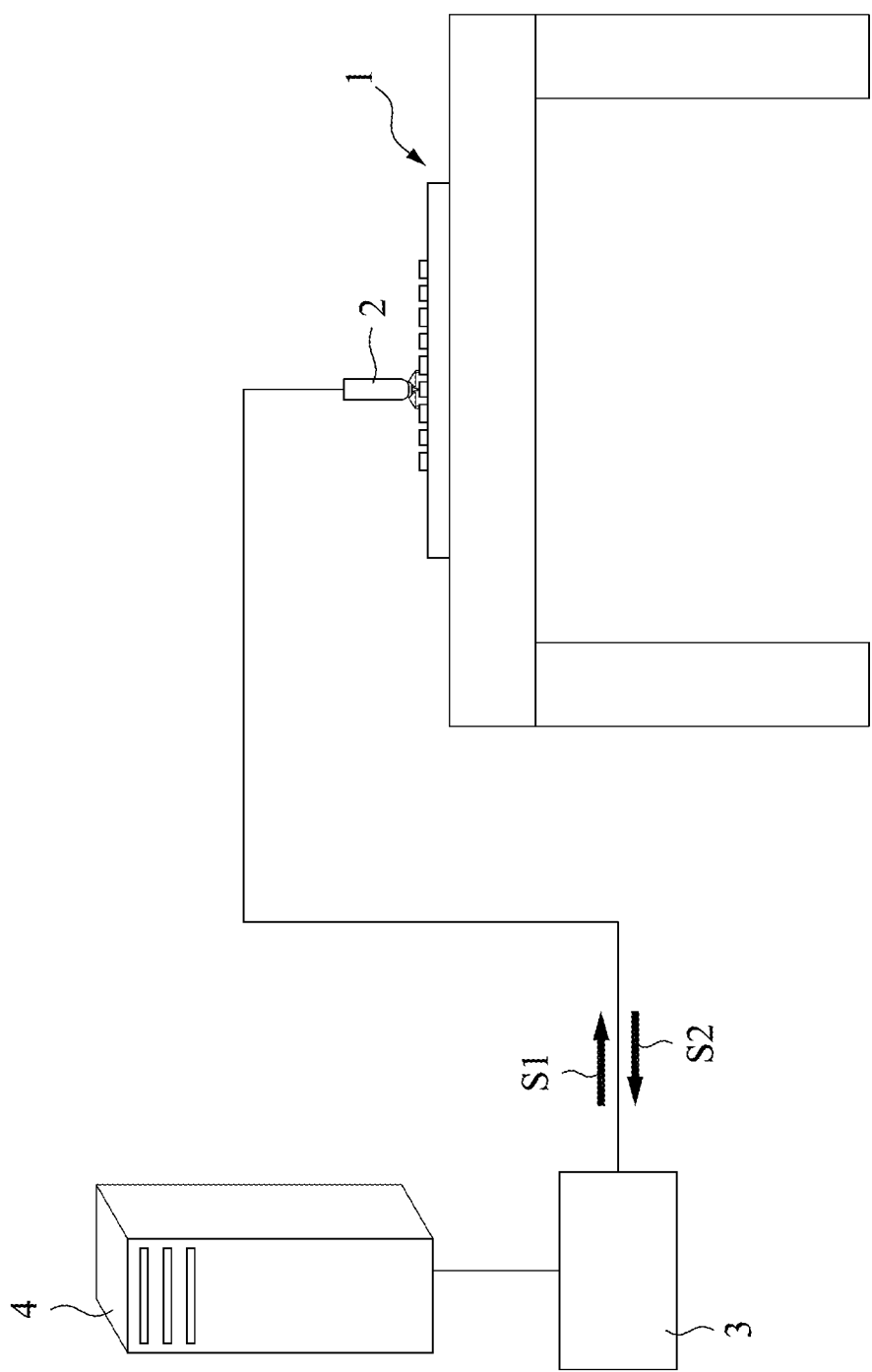
FIG. 4 is a schematic diagram illustrating inspection for the bare circuit board of FIG. 1 by using a measurement device and the probe.

FIG. 4 is a schematic diagram illustrating inspection for the bare circuit board 1 of FIG. 1 by using a measurement device 3 and the probe 2. Referring to FIG. 4, for example, the measurement device 3 is a vector network analyzer (VNA) or a time domain reflectometer (TDR). The measurement device 3 is electrically connected to the probe 2 and transmits the signal to the bare circuit board 1 or receives the signal from the bare circuit board 1 successfully by the probe 2 in electrical contact with each trace 15 and the corresponding ground parts 141 (referring to FIGS. 1 and 2).

In addition, the measurement device 3 further communicates with a control device 4. The control device 4 may be a computer, such as a desktop computer, an industrial computer or a laptop. Alternatively, the control device 190 also may be a microprocessor. For example, the control device 4 can be electrically connected to the measurement device 3 via a universal serial bus (USB). Alternatively, the control device 4 can be in wireless communication with the measurement device 3 by Bluetooth or wireless network (such as Wi-Fi).

Referring to FIGS. 2 to 4, when the bare circuit board 1 is inspected, the control device 4 may control the measurement device 3 to generate a first testing signal S1. The measurement device 3 can output the first testing signal S1 to one of the measuring regions 153 of the traces 15 (FIG. 2) via the probe 2, and the first testing signal S1 is transmitted to the corresponding antenna 12*a* or 12*b*. The first testing signal S1 is an electric signal, which can be transmitted by the circuit only and cannot be transmitted by radiation or radio. The corresponding antenna 12*a* or 12*b* can not only radiate a wireless signal but also output a second testing signal S2 after receiving the first testing signal S1, in which the second testing signal S2 is transmitted to the measurement device 3 via the corresponding trace 15 and the probe 2. The second testing signal S2 can be an electric signal generated by the antenna 12*a* or 12*b* due to the electromagnetic induction.

Then, the control device 4 can find out the situation in which the corresponding antenna 12*a* or 12*b* radiates the wireless signal according to the measurement of the measurement device 3 for the second testing signal S2, thereby determining whether the corresponding antenna 12*a* or 12*b* can work normally. For example, the measurement device 3 can measure at least one of the return loss, the insertion loss, the over the air (OTA) and the signal shift of the antenna 12*a* or 12*b*. The bare circuit board 1 is the wire substrate without any active component mounted, and the electric current flowing in the bare circuit board 1 passes through no active component before any active component is mounted on the bare circuit board 1. Hence, the first testing signal S1 and the second testing signal S2 also pass through no active components.

Figure 5:
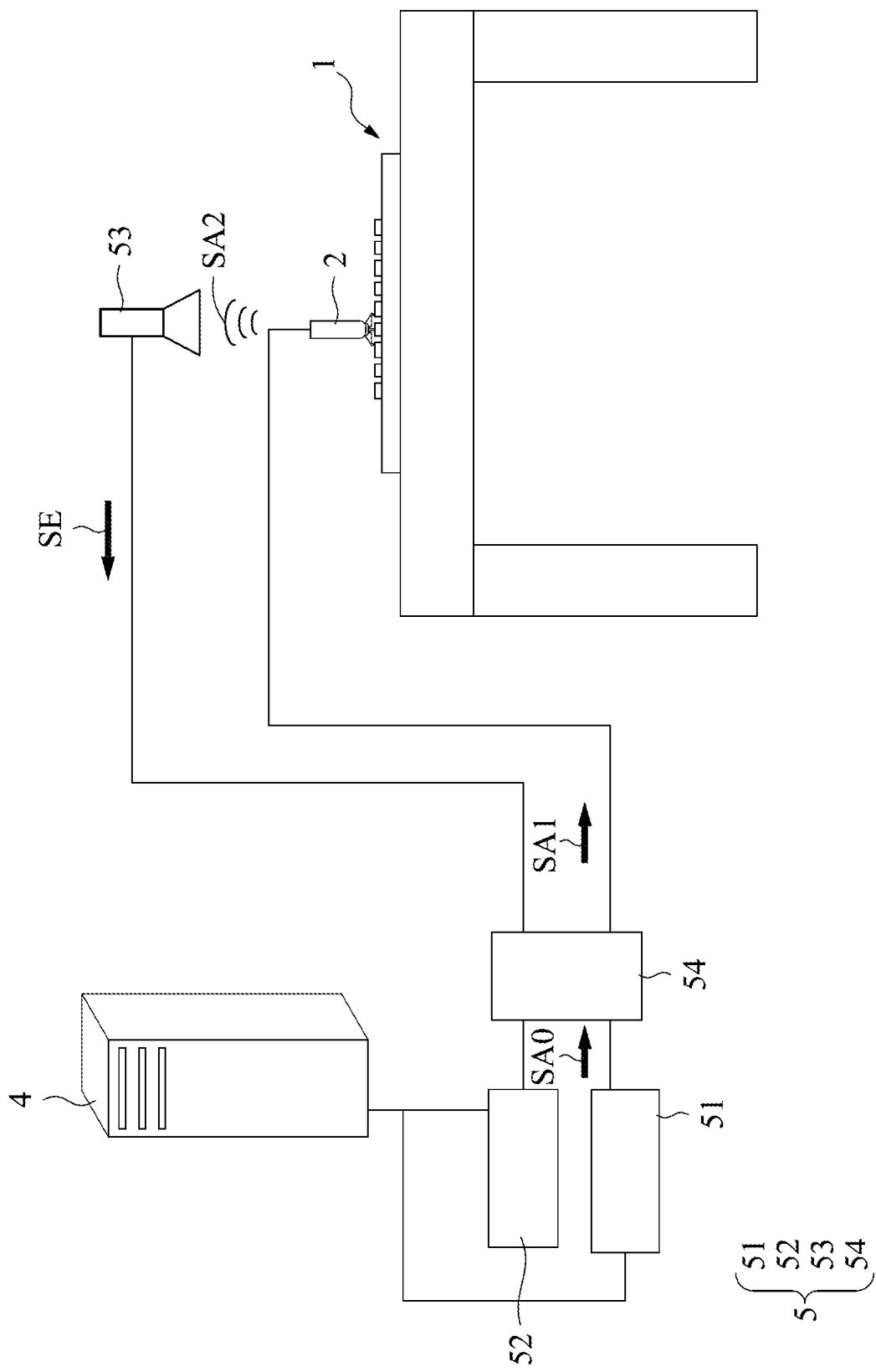
FIG. 5 is a schematic diagram illustrating inspection for the bare circuit board of FIG. 1 by using another measurement device and the probe.

FIG. 5 is a schematic diagram illustrating inspection for the bare circuit board 1 of FIG. 1 by using another measurement device 5 and the probe 2. Referring to FIGS. 2, 3 and 5, the measurement device 5 may include a vector signal generator (VSG) 51, a vector signal analyzer (VSA) 52 and a transceiver antenna 53. The vector signal generator 51 is electrically connected to the probe 2. The transceiver antenna 53 is electrically connected to the vector signal analyzer 52 and can align with the antennas 12*a* and 12*b* under inspection. The transceiver antenna 53 may be a horn antenna. The control device 4 communicates with the vector signal generator 51 and the vector signal analyzer 52.

In addition, the measurement device 5 may further include a frequency converter 54. The frequency converter 54 may convert frequencies of the signals outputting from the vector signal generator 51 and received by the vector signal analyzer 52 according to the frequency of the signal transmitted on the bare circuit board 1. For example, the frequency converter 54 may make frequency up or down conversion. The frequency converter 54 is electrically connected between the vector signal generator 51 and the probe 2, and between the vector signal analyzer 52 and the transceiver antenna 53.

When the bare circuit board 1 is inspected, the control device 4 may control the vector signal generator 51 to generate an initial testing signal SA0, and the frequency converter 54 can change the frequency of the initial testing signal SA0 so as to convert the initial testing signal SA0 to a first testing signal SA1. Then, the measurement device 5 can generate the first testing signal SA1 to the inspected one of measuring regions 153 of the traces 15 via the probe 2, and the first testing signal SA1 is transmitted to the corresponding antenna 12*a* or 12*b*, in which the first testing signal SA1 is an electric signal. The corresponding antenna 12*a* or 12*b* generates a second testing signal SA2 after receiving the first testing signal SA1, in which the second testing signal SA2 is a wireless signal radiated by the antenna 12*a* or 12*b*. Because the bare circuit board 1 is the wire substrate without any active component mounted, the first testing signal SA1 and the second testing signal SA2 also pass through no active component.

The transceiver antenna 53 can receive the second testing signal SA2 and convert the second testing signal SA2 to an electric signal SE, in which the electric signal SE can be transmitted to the vector signal analyzer 52, such that the measurement device 5 measures the corresponding antenna 12*a* or 12*b* according to the second testing signal SA2. By using the vector signal generator 51 and the vector signal analyzer 52, the measurement device 5 can measure at least one of error vector magnitude (EVM) and radio power of the corresponding antenna 12*a* or 12*b* according to the second testing signal SA2. In addition, the control device 4 can control the measurement device 5 to generate the first testing signal SA1 and to measure the corresponding antenna 12*a* or 12*b*, so as to pick the qualified bare circuit board.

Figure 6:
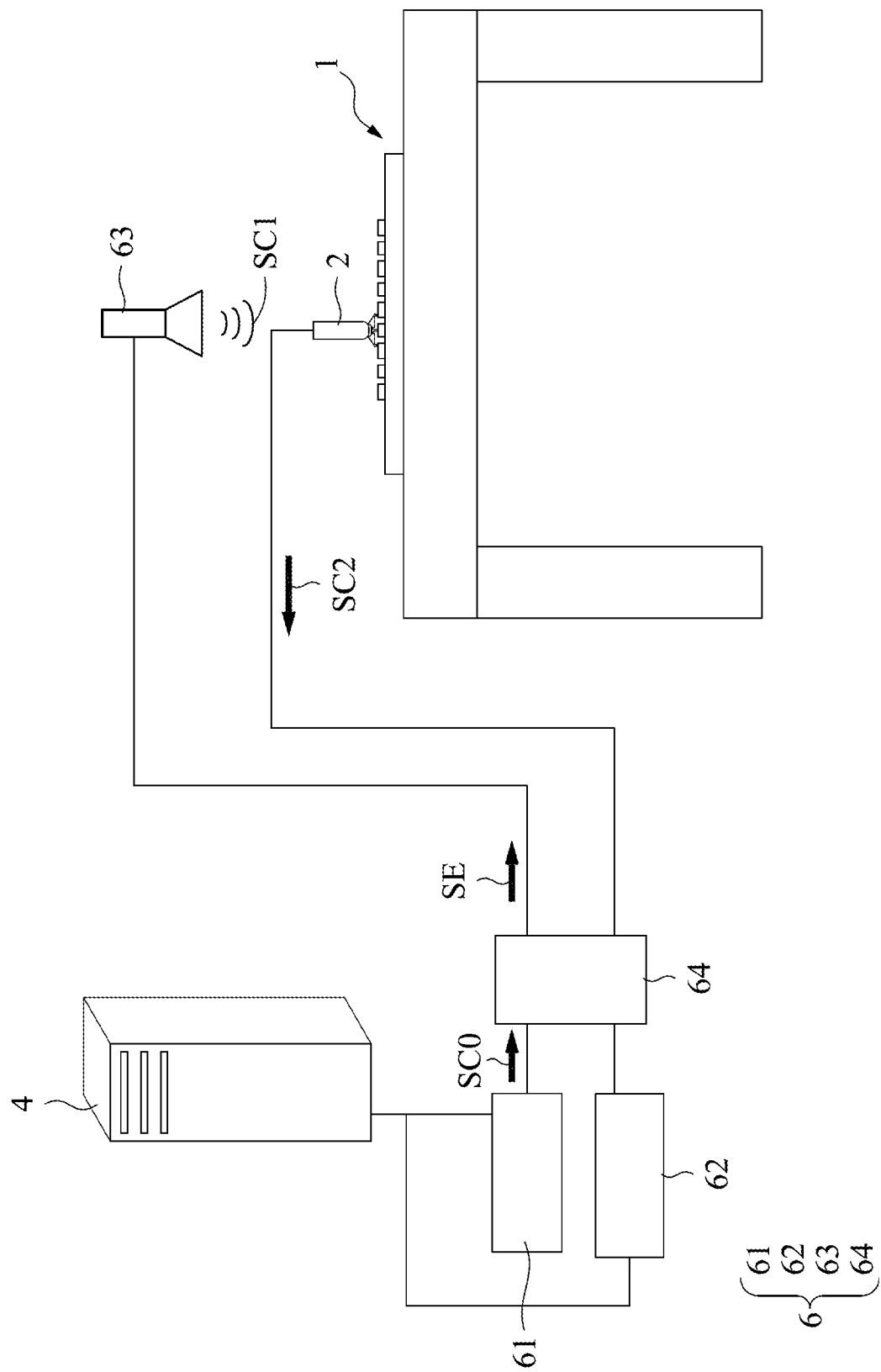
FIG. 6 is a schematic diagram illustrating inspection for the bare circuit board of FIG. 1 by using another measurement device and the probe.

FIG. 6 is a schematic diagram illustrating inspection for the bare circuit board 1 of FIG. 1 by using another measurement device 6 and the probe 2. Referring to FIG. 6, the measurement device 6 in FIG. 6 is similar to the measurement device 5 in FIG. 5. The measurement device 6 may include a vector signal generator 61, a vector signal analyzer 62, a transceiver antenna 63 and a frequency converter 64. The similar and the same features of the measurement device 5 and the measurement device 6 substantially don't repeat anymore. In contrast with the measurement device 5 in FIG. 5, in the measurement device 6, the vector signal generator 61 is electrically connected to the transceiver antenna 63, and the vector signal analyzer 62 is electrically connected to the probe 2.

Referring to FIGS. 2, 3 and 6, when the bare circuit board 1 is inspected, the control device 4 may control the vector signal generator 61 to generate an initial testing signal SC0, and the frequency converter 64 can change the frequency of the initial testing signal SC0 so as to convert the initial testing signal SC0 to the electric signal SE. Then, the electric signal SE is transmitted to the transceiver antenna 63 such that the transceiver antenna 63 radiate a first testing signal SC1 towards the antennas 12*a* and 12*b*, in which the first testing signal SC1 is a wireless signal radiated by the transceiver antenna 63.

When the transceiver antenna 63 radiates the first testing signal SC1, the antenna 12*a* or 12*b* under inspection can receive the first testing signal SC1 and generate a second testing signal SC2 which is an electric signal, and the second testing signal SC2 can be transmitted to the probe 2 via the corresponding trace 15 and enter the vector signal analyzer 62 of the measurement device 6 such that the measurement device 6 measures the corresponding antenna 12a or 12b according to the second testing signal SC2. By using the vector signal generator 61 and the vector signal analyzer 62, the measurement device 6 can measure at least one of error vector magnitude and receiving power of the corresponding antenna 12a and 12b according to the second testing signal SC2.

It is noted that the bare circuit boards 1 illustrated in FIGS. 3 to 6 respectively are not on the same scale as the bare circuit board 1 illustrated in FIG. 1. Specifically, FIG. 3 primarily and clearly shows that the probe 2 can be electrically connected to the traces 15 and the corresponding ground parts 141. FIGS. 4 to 6 primarily and clearly show that the measurement device 3, 5 or 6 with the probe 2 inspect the bare circuit board 1.

From the above, the widths D of the measuring gaps 16 formed between the traces 15 and edges of the ground patterns 14 can be obtained according to the frequency of the signal transmitted in the bare circuit board 1 and the equations (1), (2) and (3), so that not only may the measurement device 3, 5 or 6 with the probe 2 directly inspect the bare circuit board 1 without using the RF chip for inspection, but also the bare circuit board 1 may achieve the gap design complying with the frequency of the signal, thereby promoting performance for suppressing noise when the bare circuit board 1 transmits the signal. The bare circuit board 1 in this embodiment can be directly measured by the measurement device 3, 5 and 6 so as to eliminate the extra time and cost of mounting the RF chip for inspection, and the quality in electrical properties and the wireless signals of the bare circuit board 1 can be directly obtained from the inspection results.

Figure 7:
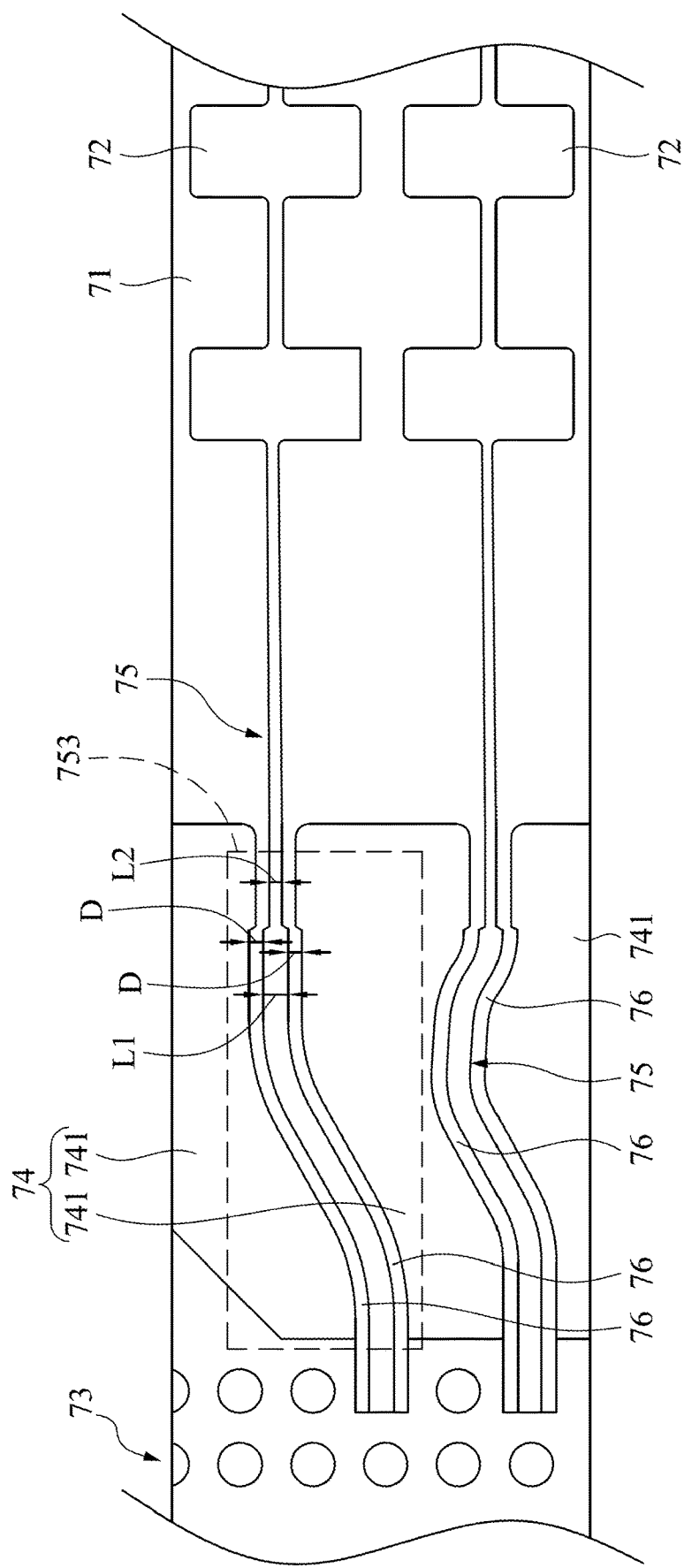
FIG. 7 is a top view of a bare circuit board according to another embodiment of this disclosure.

FIG. 7 is a top view of a bare circuit board 7 according to another embodiment of this disclosure. Referring to FIG. 7, the bare circuit board 7 in FIG. 7 is similar to the bare circuit board 1 in FIG. 1. The bare circuit board 7 includes a substrate 71, a plurality of antennas 72, a plurality of chip pads 73, a ground pattern 74 and a plurality of traces 75. The similar and the same features of the bare circuit board 1 and the bare circuit board 7 substantially don't repeat anymore. In contrast with the bare circuit board 1 in FIG. 1, any trace 75 in a corresponding measuring region 753 of the bare circuit board 7 substantially has a first line width L1 and a second line width L2, in which the first line width L1 is bigger than the second line width L2.

In addition, the shapes of the ground parts 741 can be changed according to the shape and the width of each trace 75 so that each measuring gap 76 located between each trace 75 and the edge of the adjacent ground part 741 has a width similar to the width D illustrated in FIG. 1. That is, the width D of each measuring gap 76 is smaller than the quarter of the equivalent wavelength of the signal. Hence, in this example, the bare circuit board 7 is also directly inspected by the aforementioned measurement device 3, 5, or 6 with the probe 2. The inspection method is similar to those in FIGS. 3 to 6, which don't repeat here anymore.

Figure 8:
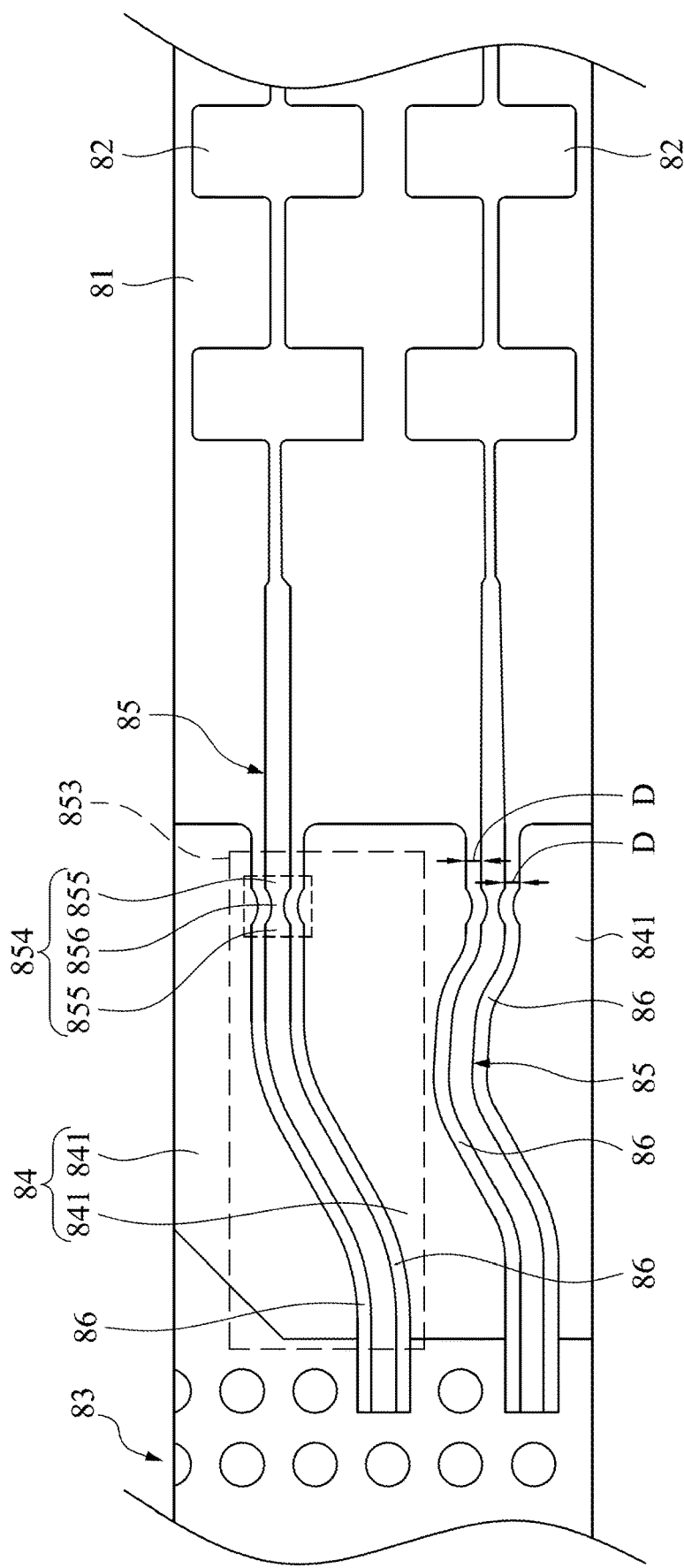
FIG. 8 is a top view of a bare circuit board according to another embodiment of this disclosure.

FIG. 8 is a top view of a bare circuit board 8 according to another embodiment of this disclosure. Referring to FIG. 8, the bare circuit board 8 in FIG. 8 is similar to the bare circuit board 1 in FIG. 1. The bare circuit board 8 includes a substrate 81, a plurality of antennas 82, a plurality of chip pads 83, a ground pattern 84 and a plurality of traces 85. The similar and the same features of the bare circuit board 1 and the bare circuit board 8 substantially don't repeat anymore. In contrast with the bare circuit board 1 in FIG. 1, any trace 85 in a corresponding measuring region 853 of the bare circuit board 8 has at least one measurement section 854. Because the at least one measurement section 854 is in each measuring region 853, the at least one measurement section 854 is also adjacent to two corresponding measuring gaps 86.

Taking FIG. 8 for example, each trace 85 in the corresponding measuring region 853 has a measurement section 854. In other embodiments, the quantity of the measurement sections 854 of any trace 85 in one corresponding measuring region 853 may be multiple. The measurement section 854 includes a pair of end parts 855 and a central part 856, in which the central part 856 is located between two end parts 855, and the width of the measurement section 854 diminishes gradually from one of the end parts 855 to the central part 856.

In addition, the shapes of the ground parts 841 can be changed according to the shape and the width of each trace 85 so that each measuring gap 86 located between each trace 85 and an edge of the adjacent ground part 841 has a width similar to the width D illustrated in FIG. 1. Hence, in this example, the bare circuit board 8 is also directly inspected by the aforementioned measurement device 3, 5, or 6 with the probe 2. The inspection method is similar to those in FIGS. 3 to 6, which don't repeat here anymore. It should be additionally noted that edges of the measurement section 854 take the shape of semicircles in this example. Taking FIG. 8 for example, opposite two of the edges of the measurement section 854 are shown hyperbolic shape. In other embodiment, edges of the measurement section 854 can take the shape of triangles.

Figure 9:
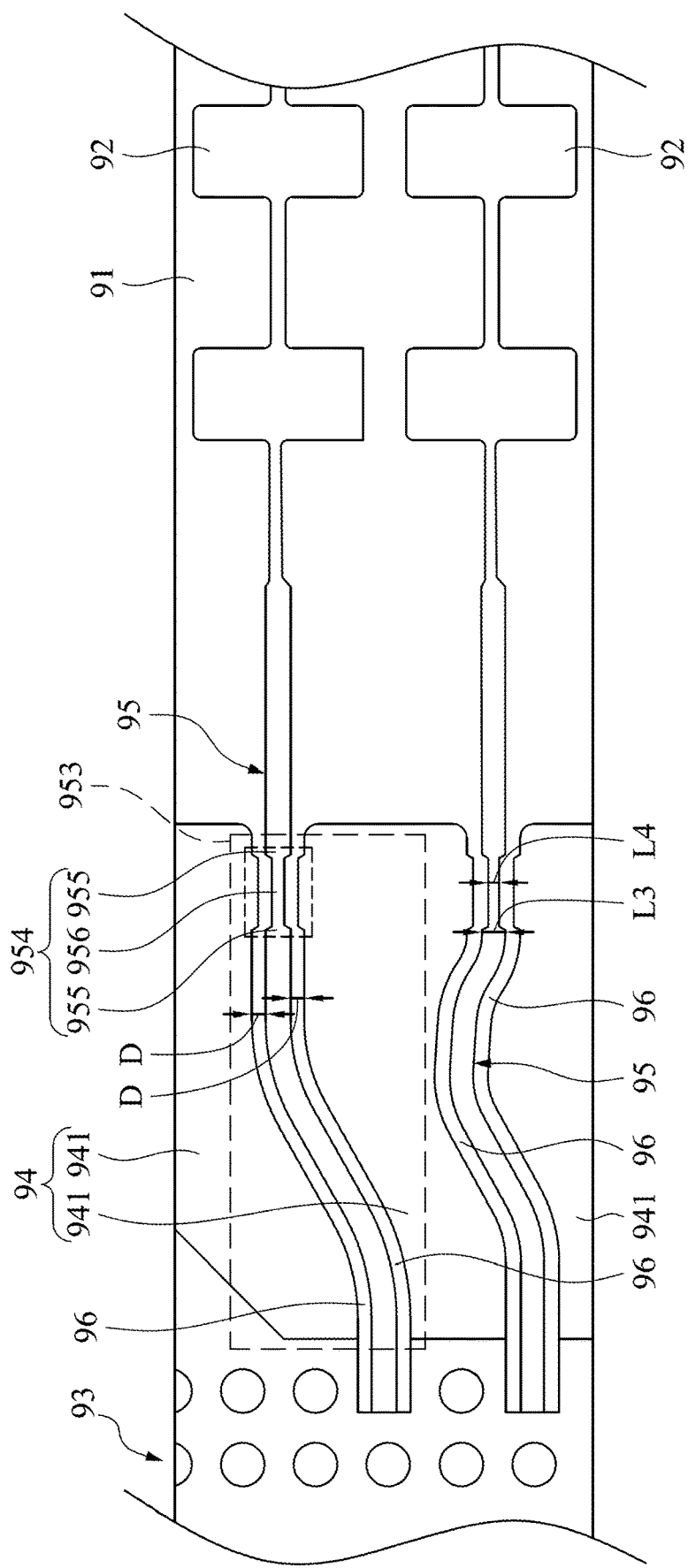
FIG. 9 is a top view of a bare circuit board according to another embodiment of this disclosure.

FIG. 9 is a top view of a bare circuit board 9 according to another embodiment of this disclosure. Referring to FIG. 9, the bare circuit board 9 in FIG. 9 is similar to the bare circuit board 1 in FIG. 1. The bare circuit board 9 includes a substrate 91, a plurality of antennas 92, a plurality of chip pads 93, a ground pattern 94 and a plurality of traces 95. The similar and the same features of the bare circuit board 1 and the bare circuit board 9 substantially don't repeat anymore. In contrast with the bare circuit board 1 in FIG. 1, any trace 95 in a corresponding measuring region 953 of the bare circuit board 9 has at least one measurement section 954. Because the at least one measurement section 954 is in each measuring region 953, the at least one measurement section 954 is also adjacent to the corresponding two of the measuring gaps 96. Taking FIG. 9 for example, each trace 95 in the corresponding measuring region 953 has a measurement section 954. In other embodiments, the quantity of the measurement sections 954 of any trace 95 in the corresponding measuring region 953 may be multiple.

The measurement section 954 includes a pair of end parts 955 and a central part 956, in which the central part 956 is located between two end parts 955. Each end part 955 has a first line width L3, and the central part 956 has a second line width L4. The first line width L3 is bigger than the second line width L4. In addition, the shapes of the ground parts 941 can be changed according to the shape and the width of each trace 95 so that each measuring gap 96 located between each trace 95 and an edge of the adjacent ground part 941 has a width similar to the width D illustrated in FIG. 1. Hence, in this example, the bare circuit board 9 is also directly inspected by the aforementioned measurement device 3, 5, or 6 with the probe 2. The inspection method is similar to those in FIGS. 3 to 6, which don't repeat here anymore.

Based on the above, the shapes and the widths of the traces 75, 85, and 95 can be changed according to requirements for actual products, and the corresponding ground patterns 74, 84, and 94 can be changed according to the shapes and the widths of the traces 75, 85, and 95, so that the width D of each measuring gap (e.g., measuring gap 76, 86 or 96) formed between each trace (e.g., trace 75, 85 or 95) and the edge of adjacent one of ground parts (e.g., ground parts 741, 841, or 941) is smaller than the quarter of the equivalent wavelength of the signal, thereby using the measurement device 3, 5, or 6 with the probe 2 to directly inspect the bare circuit board 7, 8, and 9.

Consequently, the bare circuit board disclosed from above embodiments may be directly inspected by the measurement device via the probe without using the RF chip for inspection to obtain inspection results of the electrical properties and the wireless signals, thereby picking the qualified bare circuit boards.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A bare circuit board, comprising:
    a substrate comprising a surface;
    an antenna formed on the substrate;
    a chip pad formed on the substrate;
    a ground pattern formed on the surface; and
    a trace formed on the surface and configured to be without connecting the ground pattern,
    wherein a measuring gap is formed between the trace and an edge of the ground pattern, and the trace comprises a first end and a second end,
    wherein the first end is electrically connected to the chip pad, wherein the second end is electrically connected to the antenna, and
    wherein the bare circuit board is adapted to transmit a signal, and a width of the measuring gap is smaller than a quarter of an equivalent wavelength of the signal.

2. The bare circuit board of claim 1, wherein the antenna and the chip pad are all formed on the surface.

3. The bare circuit board of claim 1, wherein a frequency of the signal is in a range of 0.1 GHz to 110 GHz.

4. The bare circuit board of claim 1, wherein the width of the measuring gap is smaller than or equal to 150 μm when a frequency of the signal is greater than 110 GHz.

5. The bare circuit board of claim 1, wherein the width of the measuring gap is in a range of 150 μm to 400 μm when a frequency of the signal is greater than 45 GHz and less than 110 GHz.

6. The bare circuit board of claim 1, wherein the width of the measuring gap is in a range of 400 μm to 650 μm when a frequency of the signal is greater than 0 Hz and less than 45 GHz.

7. The bare circuit board of claim 1, wherein at least one part of the measuring gap has a constant width.

8. The bare circuit board of claim 1, wherein a material of the substrate comprises at least one of polytetrafluoroethylene, polyphenylene oxide, cyanate ester resin, bismaleimide triazine resin, glass, liquid crystal polymer, polyimide and tetra-(4-pyridylphenyl) ethylene.

9. The bare circuit board of claim 1, wherein the substrate has a dielectric constant in a range of 3.3 to 3.7.

10. The bare circuit board of claim 1, wherein a material of the antenna comprises metal or alloy.

11. The bare circuit board of claim 10, wherein the material of the antenna further comprises nonmetal.

12. The bare circuit board of claim 1, wherein the trace has a first line width and a second line width, and the first line width is bigger than the second line width.

13. The bare circuit board of claim 12, wherein the trace has a measurement section which is adjacent to the measuring gap and comprises:
    a pair of end parts; and
    a central part located between the end parts, wherein the end parts have the first line width apiece, and the central part has the second line width.

14. The bare circuit board of claim 1, wherein the trace has a measurement section which is adjacent to the measuring gap and comprises:
    a pair of end parts; and
    a central part located between the end parts, wherein the width of the measurement section diminishes gradually from one of the end parts to the central part.

15. The bare circuit board of claim 1, wherein the ground pattern comprises a plurality of ground parts and the trace is located between adjacent two of the ground parts.

* * * * *